(12) United States Patent
Frederick et al.

(10) Patent No.: US 6,861,840 B2
(45) Date of Patent: Mar. 1, 2005

(54) GENERATION OF SYNTHETIC NUCLEAR MAGNETIC RESONANCE SIGNALS

(75) Inventors: Blaise deB. Frederick, Watertown, MA (US); Michael L. Rohan, Cambridge, MA (US)

(73) Assignee: McLean Hospital Corporation, Belmont, MA (US)

( * ) Notice: Subject to any disclaimer, the term of this patent is extended or adjusted under 35 U.S.C. 154(b) by 58 days.

(21) Appl. No.: 09/909,932

(22) Filed: Jul. 20, 2001

(65) Prior Publication Data

US 2003/0016014 A1 Jan. 23, 2003

(51) Int. Cl.$^7$ ................................................ G01V 3/00
(52) U.S. Cl. ...................................... 324/307; 324/309
(58) Field of Search ............................ 324/307, 309, 324/322, 318, 319, 310, 314, 313, 320, 414

(56) References Cited

U.S. PATENT DOCUMENTS

| | | | |
|---|---|---|---|
| 4,014,109 A | | 3/1977 | Schramm ........................ 35/17 |
| 4,707,797 A | * | 11/1987 | Briggs ............................ 708/8 |
| 4,719,406 A | | 1/1988 | Schaefer et al. ............. 324/318 |
| 4,736,751 A | * | 4/1988 | Gevins et al. ............... 128/732 |
| 4,789,830 A | | 12/1988 | Stokar ........................ 324/308 |
| 4,818,943 A | | 4/1989 | Chandra ...................... 324/318 |
| 5,381,094 A | | 1/1995 | van Heelsbergen et al. 324/318 |
| 5,397,987 A | * | 3/1995 | Garritano .................... 324/307 |
| 6,025,717 A | * | 2/2000 | Hertz et al. ................. 324/310 |
| 6,242,915 B1 | * | 6/2001 | Hurd ........................... 324/309 |
| 6,400,157 B1 | * | 6/2002 | Bonanni et al. ............. 324/322 |
| 6,452,392 B1 | * | 9/2002 | Wetzel ........................ 324/318 |
| 6,549,009 B1 | * | 4/2003 | Hertz et al. ................. 324/309 |
| 6,621,433 B1 | * | 9/2003 | Hertz ........................... 341/139 |

OTHER PUBLICATIONS

B The Sciences and Engineering, 59(9):4762–B, 1999.
Volker Hornback et al., "The Dependence of EM Energy Absorption Upon Human Head Modeling at 900 MHz," IEEE Transactions on Microwave Theory and Techniques, 44(10):1865–1873, 1996.
Sebok et al., "Interleaved Magnetic Resonance and Ultrasound by Electronic Synchronization," A Journal of Clinical and Laboratory Research Investigative Radiology, 26(4):353–57, 1991.
H. C. Taylor et al, "FDTD Modeling for Microwave Dosimetry and Thermography," 1995.
Torsten Sommer, MD, et al., "MR Imaging and Cardiac Pacemakers: In Vitro Evaluation and in Vivo Studies in 51 Patients at 0.5 T," Radiology 215(3):869–879.

* cited by examiner

*Primary Examiner*—Brij B. Shrivastav
(74) *Attorney, Agent, or Firm*—Fish & Richardson P.C.

(57) ABSTRACT

The invention involves an active phantom that transmits a waveform based on data reflecting free induction decay signals. The methods and apparatuses of the invention can be used, for example, to test and calibrate a magnetic resonance scanner; evaluate image acquisition parameters and reconstruction algorithms; and train scanner operators. In addition, the invention can simulate complex samples, e.g., a human brain without requiring human subject available to submit to the time and discomfort of a magnetic resonance scan.

40 Claims, 1 Drawing Sheet

GENERATION OF SYNTHETIC NUCLEAR MAGNETIC RESONANCE SIGNALS

TECHNICAL FIELD

This invention relates to the generation of synthetic nuclear magnetic resonance signals.

BACKGROUND

In traditional magnetic resonance imaging (MRI), a patient lies in a static magnetic field and is subjected to an imaging sequence using radiofrequency (RF) pulses and spatial and temporal magnetic field gradients. MRI uses the property of nuclear spin to collect image data. Nuclei with unpaired nucleons (protons or neutrons) possess a property known as spin, which results in a non-zero magnetic moment that can be used to conduct MRI, see, e.g., U.S. Pat. No. 5,397,987, which is incorporated by reference herein. Hydrogen nuclei have a single proton, and many MRI techniques utilize hydrogen nuclei since they are pervasive in human tissue. When a subject is placed in a main magnetic field, its nuclei align in the direction of the field (i.e., along the "magnetization axis"); the orientation of the nuclei can be represented by a magnetization vector, see, e.g., Horowitz, *MRI Physics for Radiologists: A Visual Approach*, 1995, which is incorporated by reference herein. In the classical physical description of magnetic resonance, these spinning nuclei can precess in a conical manner around the magnetization axis, generally out-of-phase with respect to each other.

To induce in-phase spinning at the resonance frequency of particular nuclei, a high-powered radio frequency excitation pulse, frequently in the kilowatt range, is broadcast at that resonance frequency. This RF pulse also causes the nuclei in a sample (e.g., a human brain) to rotate with respect to the magnetization vector created by the main magnetic field, see, e.g., Horowitz, *MRI Physics for Radiologists: A Visual Approach*, 1995, incorporated by reference herein. The spinning nuclei in the sample generate RF signals, which decay over time. Time-varying gradient magnetic fields are applied after the RF excitation pulse to permit spatial resolution of the decaying RF signals. Thus, the RF excitation pulse and the time-varying gradient magnetic fields together cause the sample to emit time-varying MR RF signals known as "free induction decay" (FID) signals. An antenna in the magnetic resonance (MR) scanner receives these FID signals, and these MR imaging signals are transmitted to a processor. The processor uses these signals to generate MR images that reflect the spatial distribution or chemical environment of the spinning nuclei.

SUMMARY

In one aspect, the invention is an apparatus for transmitting a waveform reflecting a time-varying MR RF signal. The apparatus has a waveform generator that uses data reflecting a time-varying MR RF signal to generate a waveform having a time-varying property (e.g., amplitude, frequency, or phase). A signal transmitter transmits the waveform having the time-varying property to a MR scanner.

In another aspect, the invention includes a method of transmitting a waveform reflecting a MR RF signal that involves providing data reflecting the MR RF decay signal to a waveform generator, generating a waveform having a time-varying property based on the data reflecting the MR RF signal using the waveform generator, and transmitting the waveform having the time-varying property to an MR scanner.

Generating a waveform based on time-varying MR RF signals offers several advantages. The time-varying MR RF signal can be the type of signal emitted by a sample (e.g. a human brain) in MRI or MR spectroscopy. Alternatively, the signal can be an artificial construction that does not correspond to a signal emitted by a physical sample. Consequently, the apparatus can provide waveforms for creating desired images and spectra. The waveforms for creating these images and spectra can be generated repeatably, since the apparatus can reproduce an identical waveform on demand. Since MRI is often used to image dynamic samples such as a human brain, an apparatus that can generate repeatable results offers distinct benefits. In addition, the invention can be used to make quantitative measurements because it provides a consistent baseline. Another advantage is the convenience of generating waveforms for imaging and spectroscopy without the need to subject samples to MR scans.

The repeatability, quantitative capability, and convenience offered by the invention provides numerous benefits. The consistency provided by the apparatus makes it suitable for testing, e.g., the receiving system of an MR scanner, acquisition parameters, or data processing (i.e., image reconstruction) algorithms. In performing these tests, the invention can control for possible problems in the radio frequency generation system of the MR scanner since it provides a direct source of a waveform based on a time-varying MR RF signal. This permits testing of the receiving system of the scanner separately from the RF generation system for improved troubleshooting and system calibration. Where the signal transmitter is an antenna, the entire receiving system of the MR scanner can be evaluated. In an alternative embodiment, a cable is used to feed the signal directly into the MR scanner. This not only avoids noise in antenna-to-antenna transmission but also permits differential testing of the receiving antenna in the MR system separately from the remainder of the MR receiving system. In addition, use of a cable to feed the waveform directly into the MR scanner avoids interference that could otherwise result when the apparatus is used during an MR scan.

When using the apparatus for quantitative measurements and calibration purposes, it can be useful to employ the antenna-based version of the apparatus to ensure that no potential source of systematic error in the receiving system of the MR scanner is being bypassed. The apparatus can broadcast a waveform corresponding to a baseline image while scanning a sample, permitting quantitative comparison of signal amplitudes. The waveform broadcast by the apparatus is an in-band signal, i.e., a signal within the detection band of the MR scanner's receiving antenna, and it is broadcast at a strength of milliwatts or microwatts, reducing interference with the FID signals emitted by the sample. In addition, where the waveform is broadcast by the signal transmitter, it can be designed to offer control over the spatial distribution of the transmitted signal.

The convenience offered by the apparatus facilitates activities including testing of the scanner and training of researchers and clinicians. Since the apparatus can simulate FID signals of, e.g., a human brain, it obviates the need to subject persons to uncomfortable and time-consuming MR scans solely for machine or software testing and development purposes. Similarly, the invention eliminates the need for human or animal subjects to train clinical radiologists and researchers, since it generates synthetic FID signals that can simulate the signals that these subjects would emit.

Embodiments of this aspect of the invention include one or more of the following features. The waveform generator can have a modulated frequency source, which is a baseband or intermediate frequency generator and a modulator, or a digital synthesizer. This modulated frequency source can also include an amplifier. A control device, e.g., a computer can also be included in the waveform generator. This computer can be included as part of an MR scanner or a separate computer with an appropriate hardware interface, such as an I/O card. Alternatively, the control device can be custom-designed digital or analog hardware. A keyboard can be used to program the waveform generator manually. As a result, the apparatus can be programmed on the fly to simulate the free induction signals desired at any particular time, or to analyze hypothetical patterns for, e.g., training and software development purposes.

In addition, the apparatus can be integrated into a MR scanner. Integrating the invention into an MR scanner provides a convenient means to enhance scanner functionality. The MR scanner can be linked at the input end to feed data (e.g., a clock signal) directly into the apparatus, can be attached at the output end to transmit the waveform that is generated directly to the MR scanner via a cable, or both. The apparatus can also involve a monitoring device that records FID signals, operating parameters of the MR scanner, or some other triggering input from the scanner that permits synchronization. Thus, the apparatus can adjust for variations in the execution of scan sequences among scanners. This monitoring device can be, e.g., a digital or analog signal recorder.

In another aspect, an apparatus for transmitting a waveform reflecting a MR RF signal has a storage medium that stores data reflecting the FID signal, a waveform generator that uses the stored data reflecting the FID signal to generate a waveform, and a signal transmitter that transmits the waveform to an MR scanner.

This version of the invention offers several benefits. By storing different datasets for FID signals on the storage medium, a user can employ the apparatus for diverse purposes. For example, the apparatus can simulate the MR RF signals for healthy and diseased human brains. The stored data can also include signals based on different scan parameters or can be in a form where the apparatus can generate waveforms based on various scan parameters received from another source. Thus, a clinician can be trained to recognize the differences between healthy and diseased tissue as they appear in different types of scans. This training can also be used to demonstrate that certain scan parameters provide better resolution of certain conditions and to teach clinicians how to recognize whether an additional scan could provide better a better basis for diagnosis.

In addition, testing and calibration protocols can be used to facilitate scanner maintenance and determine coil sensitivity. Data reflecting specific problems can be stored to train operators to recognize problems caused by, e.g., mechanical failures or patient movement, without disrupting the scanner or subjecting a patient to the discomfort of an MR scan. Thus, this apparatus can be a valuable "simulator," enabling users to gain more experience in a shorter period of time.

Embodiments of this aspect of the invention include the following features. The storage medium can be random access memory, a magnetic storage medium, or an optical disk. Using a removable storage medium facilitates transfer of data to and from different apparatuses. This permits sharing of data among clinicians and researchers at different locations. Using a network interface, the apparatus can receive data stored at a remote location. The apparatus also have a monitoring device that records operating parameters of a MR scanner or FID signals in the storage medium. Combining this monitoring feature with the storage feature enables the device to replicate scan sequences of specific subjects. Consequently, clinicians and researchers can share the experience of analyzing MR RF signals of subjects with rare conditions to improve their ability to recognize them.

In another aspect, the invention is an apparatus for transmitting a waveform reflecting MR imaging signals. This apparatus has a waveform generator that uses data reflecting the MR imaging signal to generate a waveform having a time-varying property. The waveform with the time-varying property is transmitted by a signal transmitter. A MR scanner receives the waveform and uses it to produce an image.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
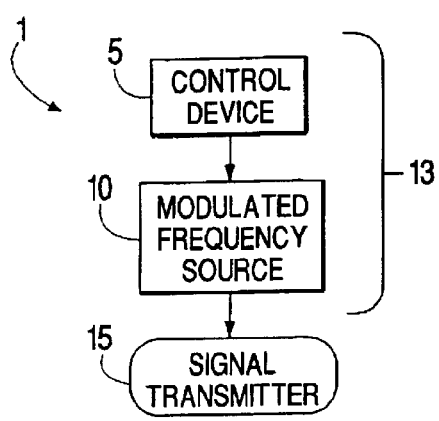
FIG. 1 is a block diagram of the present invention.

A block diagram of an apparatus 1 for transmitting a waveform that reflects a FID signal according to the present invention is shown in FIG. 1. The apparatus 1 has a control device 5, a modulated frequency source 10, and a signal transmitter 15. As shown in FIG. 1, the control device and modulated frequency source that compose the waveform generator 13 are separate components, but the waveform generator can also be a single component that integrates both the control device and modulated frequency source. The control device 5 is a computer (PowerMac G4 400 MHz), and the modulated frequency source 10 is a RF signal generator (PTS 320) coupled to a modulator (MiniCircuits mixer) and an amplifier (MiniCircuits), which drives one port of the modulator. The computer interfaces with the modulated frequency source through an I/O card (National Instruments E-series multifunction I/O board) using software (National Instruments LabVIEW). The signal transmitter 15 is a magnetic wire loop antenna. Using data reflecting a time-varying MR RF signal, the control device 5 controls the modulated frequency source to produce a waveform based on this data. The waveform based on this time-varying data therefore has at least one property (i.e., amplitude, phase, or frequency) that varies over time. The antenna broadcasts this waveform, which is detected by the receiving system of a MR scanner.

Figure 2:
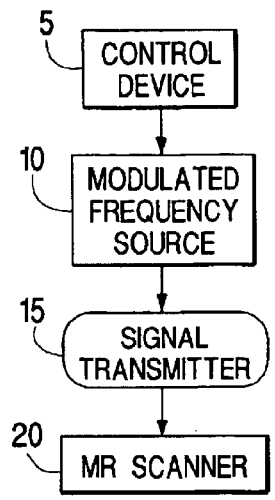
FIG. 2 is a block diagram of the present invention that transmits waveforms to a MR scanner through a direct coupling link.
Figure 3:
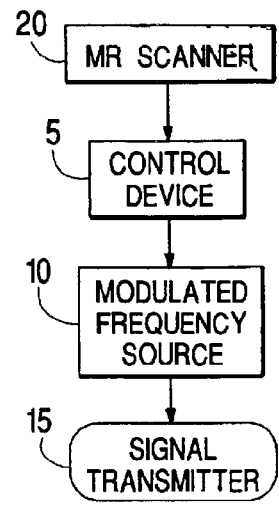
FIG. 3 is a block diagram of the present invention that receives data directly from a MR scanner.

FIGS. 2 and 3 demonstrate that an MR scanner can be coupled at either the data input end or the waveform output end of the apparatus, or both. The MR scanner can provide instructions or data directly to the waveform generator by being connected at the input end, directly receive the waveform generated by being coupled at the output end, or both. FIG. 2 shows a cable-based variation of the apparatus that, rather than using an antenna, is directly coupled at the output end to the MR scanner. In this apparatus, the waveform produced by the modulated frequency source 10 based on the instructions provided by the control device 5 is transmitted via a cable 15 to the receiving system of the MR scanner 20. In FIG. 3, the MR scanner 20 is coupled to the apparatus at the input end to, e.g., synchronize with the MR scanner by receiving a master clock signal or to provide information about the waveforms generated by the scanner. This version shows the control device 5 receiving the data reflecting a time-varying MR RF signal data directly from the MR scanner 20. The modulated frequency source 10 similarly produces a waveform that is transmitted to the receiving system of the MR scanner by the signal transmitter 15.

Figure 4:
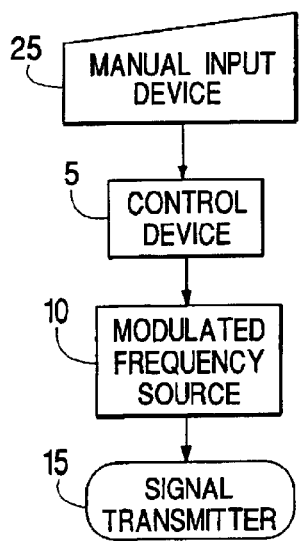
FIG. 4 is a block diagram of the present invention that takes manually entered data.
Figure 5:
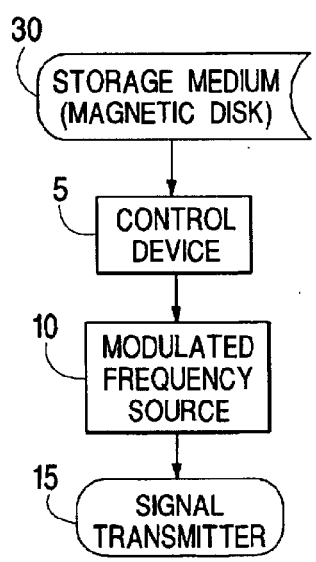
FIG. 5 is a block diagram of the present invention that receives data from a storage medium.
Figure 6:
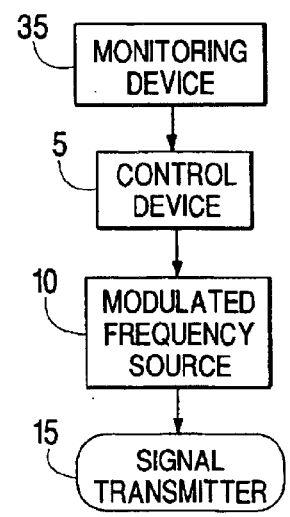
FIG. 6 is a block diagram of the present invention including a monitoring device.

Besides direct receipt of data from an MR scanner, other approaches are available to provide data to the waveform generator. One embodiment of the apparatus is adapted to receive the free induction signal data directly via manual entry by a user. FIG. 4 shows such an apparatus. The manual input device 25 for entering data is a keyboard that enables a user to provide FID signal data to the control device 5. The control device 5 uses the modulated frequency source 10 to produce a waveform that is sent via the signal transmitter 15 to the receiving system of an MR scanner. In another embodiment, a storage medium contains the FID signal data for use by the waveform generator. FIG. 5 shows a storage medium 30, a magnetic disk, that provides the data to control device 5. Thus, the control device 5 uses the modulated frequency source 10 to produce a waveform based on this stored data that is transmitted to the receiving system of an MR scanner by the signal transmitter 15. The apparatus also features an embodiment that actively gathers information from an MR scanner. FIG. 6 shows an apparatus with a monitoring device 35, a digital signal recorder, to record information from a MR scanner for use by the control device 5. This information is either the FID data itself or other information that is used to produce a waveform, such as the operating parameters of the scanner. The waveform produced by the modulated frequency source 10 according to the instructions of the control device 5 using this information is transmitted via the signal transmitter 15 to the MR scanner.

What is claimed is:

1. An apparatus for transmitting a waveform reflecting a time-varying magnetic resonance radio frequency signal comprising:
    (a) a waveform generator, wherein the waveform generator uses data reflecting the time-varying magnetic resonance radio frequency signal to generate a waveform having a time-varying property, wherein the waveform simulates a waveform of a subject undergoing a magnetic resonance scan; and
    (b) a signal transmitter that transmits the waveform having the time-varying property to a magnetic resonance scanner.

2. The apparatus of claim 1, wherein the waveform generator comprises a control device.

3. The apparatus of claim 2, wherein the control device is a computer.

4. The apparatus of claim 1, wherein the waveform generator comprises a base-band or intermediate frequency generator and modulator, or a digital frequency synthesizer.

5. The apparatus of claim 1, wherein the time-varying property is amplitude, frequency, or phase.

6. The apparatus of claim 1, wherein the signal transmitter is an antenna or cable.

7. The apparatus of claim 1, further comprising a magnetic resonance scanner.

8. The apparatus of claim 1, further comprising a keyboard.

9. The apparatus of claim 1, further comprising a monitoring device that records operating parameters of a magnetic resonance scanner or free induction decay signals.

10. The apparatus of claim 9, wherein the monitoring device is a digital or analog signal recorder.

11. An apparatus for transmitting a waveform reflecting a magnetic resonance radio frequency signal comprising:
    (a) a storage medium that stores data reflecting the magnetic resonance radio frequency signal;
    (b) a waveform generator, wherein the waveform generator uses data reflecting the magnetic resonance radio frequency signal to generate a waveform, wherein the waveform simulates a waveform of a subject undergoing a magnetic resonance scan; and
    (c) a signal transmitter that transmits the waveform to a magnetic resonance scanner.

12. The apparatus of claim 11, wherein the storage medium is random access memory, a magnetic storage medium, or an optical disk.

13. The apparatus of claim 11, wherein the waveform generator comprises a control device.

14. The apparatus of claim 13, wherein the control device is a computer.

15. The apparatus of claim 11, wherein the waveform generator comprises a base-band or intermediate frequency generator and modulator, or a digital frequency synthesizer.

16. The apparatus of claim 11, wherein the signal transmitter is an antenna or cable.

17. The apparatus of claim 11, further comprising a magnetic resonance scanner.

18. The apparatus of claim 11, further comprising a monitoring device that records operating parameters of a magnetic resonance scanner or free induction decay signals in the storage medium.

19. The apparatus of claim 18, wherein the monitoring device is a digital or analog signal recorder.

20. An apparatus for transmitting a waveform reflecting a magnetic resonance imaging signal comprising:
    (a) a waveform generator, wherein the waveform generator uses data reflecting the magnetic resonance imaging signal to generate a waveform having a time-varying property, wherein the waveform simulates a waveform of a subject undergoing a magnetic resonance scan;
    (b) a signal transmitter that transmits the waveform having the time-varying property; and
    (c) a magnetic resonance scanner that receives the waveform and uses it to produce an image.

21. The apparatus of claim 20, wherein the waveform generator comprises a control device.

22. The apparatus of claim 21, wherein the control device is a computer.

23. The apparatus of claim 20, wherein the waveform generator comprises a base-band or intermediate frequency generator and modulator, or a digital frequency synthesizer.

24. The apparatus of claim 20, wherein the signal transmitter is an antenna or cable.

25. A method of transmitting a waveform reflecting a time-varying magnetic resonance radio frequency signal comprising:

(a) providing data reflecting the time-varying magnetic resonance radio frequency signal to a waveform generator;

(b) generating a waveform having a time-varying property based on the data reflecting the time-varying magnetic resonance radio frequency signal using the waveform generator, wherein the waveform simulates a waveform of a subject undergoing a magnetic resonance scan; and (c) transmitting the waveform having the time-varying property to a magnetic resonance scanner.

26. The method of claim 25, wherein the time-varying property is amplitude, frequency, or phase.

27. The method of claim 25, further comprising:

(d) storing the data reflecting the time-varying magnetic resonance radio frequency signal.

28. The method of claim 25, further comprising:

(d) detecting the waveform having the time-varying property.

29. The method of claim 25, further comprising:

(d) testing a receiving system of a magnetic resonance scanner.

30. The method of claim 25, further comprising:

(d) calibrating a receiving system of a magnetic resonance scanner.

31. The method of claim 25, further comprising:

(d) testing data processing algorithms of a magnetic resonance scanner.

32. The method of claim 25, further comprising:

(d) training operators of a magnetic resonance scanner.

33. The method of claim 1, wherein the subject is a real subject.

34. The method of claim 11, wherein the subject is a real subject.

35. The method of claim 20, wherein the subject is a real subject.

36. The method of claim 25, wherein the subject is a real subject.

37. The method of claim 1, wherein the subject is constructed by computer programming.

38. The method of claim 11, wherein the subject is constructed by computer programming.

39. The method of claim 20, wherein the subject is constructed by computer programming.

40. The method of claim 25, wherein the subject is constructed by computer programming.

* * * * *